United States Patent
Nakazato et al.

(10) Patent No.: US 8,120,070 B2
(45) Date of Patent: Feb. 21, 2012

(54) WIRING BOARD AND METHOD FOR MANUFACTURING THE SAME

(75) Inventors: Norio Nakazato, Inzai (JP); Nobuo Fujieda, Ibaraki (JP); Masayoshi Ishibashi, Tokyo (JP); Midori Kato, Asaka (JP); Tadashi Arai, Kumagaya (JP); Takeo Shiba, Kodaira (JP)

(73) Assignee: Hitachi, Ltd., Tokyo (JP)

( * ) Notice: Subject to any disclaimer, the term of this patent is extended or adjusted under 35 U.S.C. 154(b) by 176 days.

(21) Appl. No.: 12/264,936

(22) Filed: Nov. 5, 2008

(65) Prior Publication Data

US 2009/0114958 A1    May 7, 2009

(30) Foreign Application Priority Data

Nov. 5, 2007    (JP) .................................. 2007-286865

(51) Int. Cl.
*H01L 21/311* (2006.01)
(52) U.S. Cl. .. 257/244; 257/330; 257/466; 257/E29.121
(58) Field of Classification Search .................. 438/700, 438/142, 151, 270; 257/213, 231, 244, 266, 257/288, 622, 40, 232, 234, 262, 276, 283, 257/284, 301, 302, 329, 330, 331, 332, E29.255, 257/466, E29.201, E29.257, E29.26, E29.121, 257/E27.091
See application file for complete search history.

(56) References Cited

U.S. PATENT DOCUMENTS

| | | | |
|---|---|---|---|
| 5,531,020 A | | 7/1996 | Durand et al. |
| 6,436,836 B2 * | | 8/2002 | Gobel ........................... 438/700 |
| 6,724,021 B2 * | | 4/2004 | Van Dalen et al. ........... 257/213 |
| 6,872,584 B2 * | | 3/2005 | Nakashiba ....................... 438/22 |
| 2004/0202819 A1 | | 10/2004 | Frost et al. |
| 2005/0072974 A1 | | 4/2005 | Nakamura et al. |
| 2007/0082443 A1 | | 4/2007 | Yamazaki et al. |
| 2007/0210311 A1 | | 9/2007 | Ando et al. |

FOREIGN PATENT DOCUMENTS

| | | |
|---|---|---|
| JP | 2005-353772 | 12/2005 |
| JP | 2006-007061 | 1/2006 |
| JP | 2007-158003 | 6/2007 |
| JP | 2007-243081 | 9/2007 |

OTHER PUBLICATIONS

Extended European Search Report in EP08019270.1-1235/2056342, dated Mar. 7, 2011; (4 pages).
Office Action in JP 2007-286865, mailed Nov. 1, 2011, (3 pages, in Japanese); [with partial English language translation, 3 pgs.].

* cited by examiner

*Primary Examiner* — Ha Tran T Nguyen
*Assistant Examiner* — Suberr Chi
(74) *Attorney, Agent, or Firm* — Antonelli, Terry, Stout & Kraus, LLP.

(57) ABSTRACT

A wiring board with an electronic device comprising a plurality of trenches arranged in parallel on a substrate, a common trench communicating the plurality of trenches with each other at one of their ends on the substrate, a metal layer formed at the bottom of the plurality of trenches, and an electrode layer connected with the metal layer and formed on a bottom of the common trench, wherein the electrode layer on the bottom of the common trench constitutes a source electrode or a drain electrode of a field effect transistor, whereby the wiring board and an electronic circuit having a good fine wire pattern and a good narrow gap between the patterns using a coating material can be formed, and a reduction for a cost of an organic thin film electronic device and the electronic circuit can be attained since they can be realized through a development of a printing technique.

5 Claims, 5 Drawing Sheets

WIRING BOARD AND METHOD FOR MANUFACTURING THE SAME

CLAIM OF PRIORITY

The present application claims priority from Japanese Patent application serial No. 2007-286865, filed on Nov. 5, 2007, the content of which is hereby incorporated by reference into this application.

BACKGROUND OF THE INVENTION

1. Field of the Invention

The present invention relates to a wiring board with an electronic device, and a method for manufacturing the same.

2. Description of Related Art

In recent years, technical development has been proceeded for decreasing a cost by forming a film of a predetermined pattern on a substrate by using an ink jet method. Particularly, in an organic thin film transistor using an organic semiconductor, not only a semiconductor film but also all of constituent materials such as a gate dielectric film, a gate electrode, a source electrode, and a drain electrode have been provided by coating materials applicable to the ink jet method.

However, the ink jet method has a limit for a control of a lateral size of an elongate film pattern and this hinders, for example, improvement for a switching performance of an organic transistor.

On the other hand, a study for realizing a fine wire pattern necessary for transistor performance while controlling a spreading of a coating material by use of a dam-like stepped structure referred to as a bank has proceeded (for example, refer to Document 1 (Japanese Patent Laid-open No. 2007-158003)). In this case, since a width of an elongate trench has a great concern with a finished size of a pattern width necessary for transistor performance, control for the amount of the coating material filled in the trench is difficult. Further, in the ink jet method, filling into the trench narrower than an impact area is also difficult in view of a landing accuracy. Accordingly, a portion of the trench is defined as a bank of an impact area size. However, in a case where an entire length of the trench is longer, a flowing distance of the coating material from the bank for the impact area is long to sometimes make the pattern width instable due to dry-up or deposited obstacles in the trench during flowing. As a countermeasure for the problem, it has been proposed to promote the flow by static electricity from an external electrode (for example, refer to Document 2 (Japanese Patent Laid-open No. 2006-7061)).

However, in a case of constituting, for example, the organic thin film transistor with a coating pattern, it is in a multi-layered structure. That is, since an elongate film is formed over a region where patterns for an insulation layer, a semiconductor layer and a conductor layer are disposed in a lower layer, flow interference tends to occur in the trench. Then, for the static electricity applied from the external electrode, interference of the lower layer pattern has to be taken into consideration and the electronic circuit by the application of the organic thin film transistor has to be formed while undergoing such restriction. As described above, while there have been great expectations to electronic circuits by applying electronic devices that are constituted with coating materials for realizing saving of the cost and improvement for a throughput comparable with those of printing by the technical development based on a printing technique, the problems described above produce bars.

On the other hand, in a coating material for a conductor in which metal nano-particles are dispersed in a solvent using an organic protective colloid, a compactness of a conductor structure obtained finally is low due to an effect upon decomposition of an organic protection film and a specific resistivity is increased remarkably compared with that of a bulk metal, so that lowering of a conductor resistance is essential.

For attaining a fine conductor wire by the coating material, it is necessary to increase a film thickness by a stack coating upon formation of a fine wire or metal plating after formation of the fine wire for decreasing the resistance of the conductor. Stack coating method is desirable with a reason of reducing installation cost and a shortening of steps. However, in the stack coating method, flow interference in the trench tends to occur more frequently in the second coating step, which tends to deteriorate a uniformity of a wire width. Further, when the conductor film is formed at a bottom of the trench due to a first coating, promotion of flow by static electricity becomes difficult.

For the wiring pattern width required, for example, in a wiring board, since direct drawing is possible by the ink jet system, the problem does not occur during formation of a multi-layer structure. However, for attaining an electronic circuit using the organic thin film transistor that requires the multi-layer structure as described above, a method for forming a fine wire pattern conformable to the multi-layering using the coating material is necessary.

A problem is present in a countermeasure to the flow interference in the trench. The proposal described above is applicable to the formation of the fine wire pattern for the lowermost layer. However, a pattern fabricated substrate from a substrate with a conductor layer can also be utilized in a case of forming a fine wire conductor for the lowermost layer, and the formation of the fine wire pattern for the layer thereabove is more important than the formation of the lower layer pattern. Further, there is also a problem of increasing a thickness of the fine wire by the stack coating method.

Increase for the thickness of the fine wire by the stack coating method requires repeating a coating step and a baking step. In a flexible substrate or the like, local undulation tends to occur due to the difference of the thermal expansion coefficient between the substrate and the pattern material and it is important to form a pattern by supplying the coating material at a high speed for attaining a low cost and high throughput comparable with those of printing.

Particularly, in a case of the organic thin film transistor, it is necessary to attain a gate electrode providing a low resistance at a gate length size of a fine wire width, as well as attain a gap between a source electrode and a drain electrode with a size approximate to the gate length to lower a resistance and to lower a parasitic capacitance for each of electrodes. Accordingly, while increase in the thickness and saving of the area are intended for the electrode, there is a problem that the coating layer covers the gap upon the stack coating. Since a performance of the transistor is deteriorated, it is difficult to increase the thickness of the dielectric layer over the gate.

An object of the present invention is to provide a wiring board having an organic thin film electronic device of good characteristics at a reduced cost.

SUMMARY OF THE INVENTION

In view of the above, the present invention provides a method for manufacturing a wiring board, comprising steps of forming a plurality of trench type flow channels arranged in parallel on a substrate and forming a common flow channel for communicating the trench type flow channels with each other at one of their ends on the substrate, supplying a solution containing metal particles to the flow channels, drying a solvent of the solution, and baking the metal particles remaining in the flow channels, thereby forming wirings on the substrate.

According to the method described above, a wiring board having a good fine wire pattern and a good narrow gap between the patterns can be attained.

Further, the present invention provides a wiring board provided with an electronic device, comprising a plurality of trenches arranged in parallel, a common trench in communication with ends of the trenches on one side, a metal layer disposed at the bottom of the plurality of trenches, and an electrode layer connected with the metal layer and disposed at the bottom of the common trench, wherein the electrode layer disposed in the common trench is a source electrode or a drain electrode of a field effect transistor.

According to the constitution described above, a wiring board with an electronic device having good characteristics can be attained.

According to the present invention, a wiring board with an organic thin film electronic device having good characteristics can be attained at a reduced cost.

Figure 1:
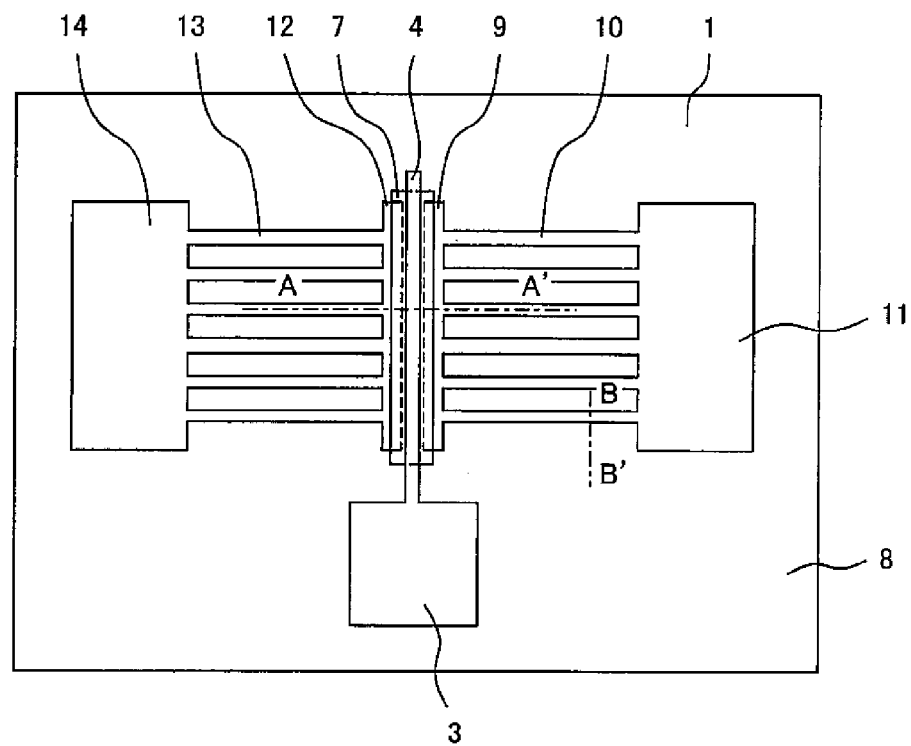
FIG. 1 is a plan view illustrating a wiring board provided with an organic thin film transistor in an embodiment of the present invention.

DETAILED DESCRIPTION OF THE INVENTION:

Then, the present invention is to be explained specifically by way of descriptions for the following embodiments. FIG. 1 is a plan view illustrating a wiring board provided with an organic thin film transistor in an embodiment of the present invention.

Figure 2:
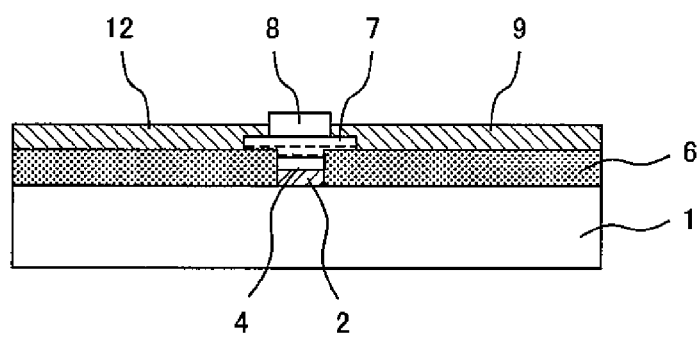
FIG. 2 is a cross sectional view along line A-A' in FIG. 1.

At first, a structure of a wiring board in a direction of a thickness is to be explained with reference to FIG. 2. As shown in FIG. 2 as a cross sectional view taken along line A-A' in FIG. 1, this is a field effect organic thin film transistor of a bottom gate structure in which a gate electrode 2, a gate dielectric film 4, an organic semiconductor thin film 7, a photosensitive resin 8, a source electrode film 9, and a drain electrode film 12, are disposed from a side nearer to a substrate 1. In FIG. 1 and FIG. 2, the gate electrode 2 is formed on the substrate 1.

A material for the substrate 1 includes resins such as polyimide, polyether sulfone (PES), liquid crystal polymer, polycarbonate (PC), polymethyl methacrylate (PMMA), polyethylene terephthalate (PET), nylon, polypropylene (PP), polyethylene (PE), polystyrene (PS), and polyethylene naphthalate (PEN). Further, it may be a glass or ceramics. Further, an oxide film or an organic insulation film may be formed and used on a silicon substrate or a metal substrate.

A method for manufacturing a wiring board in this embodiment is to be explained. At first, a surface treatment is applied as a pre-treatment to the substrate 1 with an aim of improving uniformity for a film thickness, an adhesion, an adhesion strength, etc. of a coating film. Details for the pre-treatment are not described in this embodiment.

Figure 3:
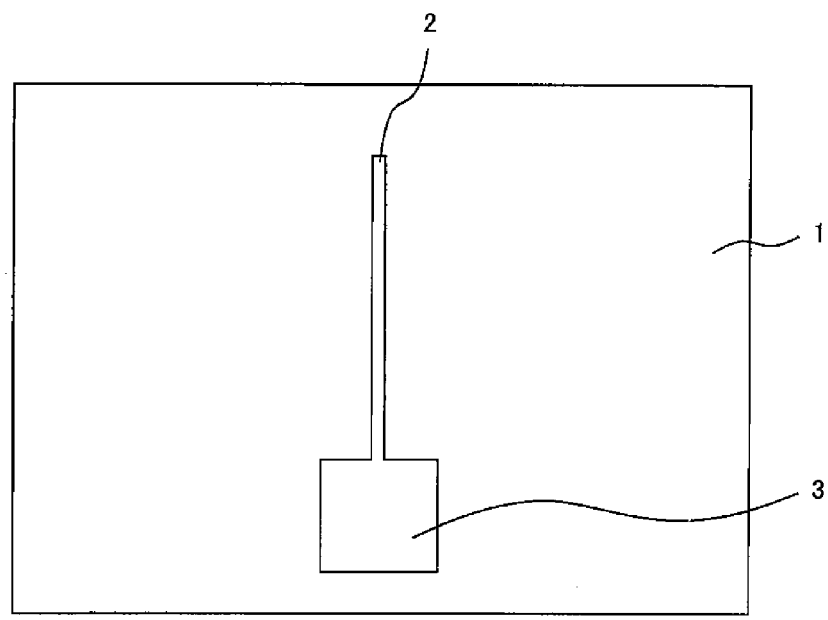
FIG. 3 is a plan view illustrating a substrate after forming a gate electrode.

FIG. 3 shows a state after forming the gate electrode 2. It is necessary that the gate electrode 2 be formed as a fine wire pattern with a width of wire of 10 μm or less. Then, the gate electrode 2 is formed above the substrate 1 by forming a metal film on the substrate 1 by a vapor deposition method or a sputtering method, and applying etching fabrication to the metal film by using photolithography. For providing the metal film, a substrate to which a metal foil is bonded by means of an adhesive sheet or the like may also be utilized.

Further, the metal film may also be formed by using a conductive coating material in the same manner as a method described later. Referring to the method for forming the gate electrode 2, a polyimide type photosensitive resin film 6 is coated over the substrate 1, and a trench pattern is formed in the photosensitive insulation film 6 by a photolithography. In this method, after filling a conductive coating material such as a silver nano-ink in which silver nano-particles, for example, are dispersed with an organic protection film into a solvent, an electrode is formed by a drying and baking treatment.

As the method for filling the conductive coating material described above, an inkjet, a dropping by discharge from a dispenser, or a coating method using a spray coater or a roll coater can be utilized. Further, the material can be filled easily by utilizing the liquid repellency on a surface of the photosensitive insulation film 6.

In a case of filling the conductive coating material by the coating method, when the coating material at a periphery of the gate electrode 2 becomes excessive, the excess portion flows from the trench forming the gate electrode 2 to the bank forming the lead electrode 3. On the contrary, when the amount of the coating material to the trench forming the gate electrode 2 is insufficient, for example, when a coater feed speed is high, the coating material flows from the bank forming the lead electrode 3 into the trench forming the gate electrode 2. This provides an ink buffer function of automatically controlling the excess or insufficiency of the conductive coating material by the trench forming the gate electrode 2 and the bank forming the lead electrode 3 and can cope with a high speed printing by a coater.

Then, a gate dielectric film 4 of an identical shape is formed on the pattern of the gate electrode 2. When the gate electrode 2 is fabricated by an etching method, the photosensitive insulation film 6 can be used as a substitute for an etching mask. An insulation film 5 on a portion from the gate electrode 2 to the lead electrode 3 can be removed by laser abrasion in the succeeding step to expose a surface of each of the electrodes.

When a light permeable substrate capable of utilizing a back surface exposure treatment is used, the gate insulation film 4 can be formed also by a method of coating a photosensitive insulation film after forming the gate electrode 2 and applying exposure from the back of the substrate using the gate electrode 2 as a mask in addition to the method described above.

Alternatively, it can also be formed by a usual positional aligning exposure treatment, for example, by a direct imaging exposure method.

Further, when an insulation resin is disposed by a coating material filling method on a side wall of the gate electrode 2 for improving a gate withstanding voltage, the gate electrode 4 can be formed by ensuring the depth of the trench additionally by so much as the thickness of the gate dielectric film and filling the trench after forming the gate electrode 2 with an insulation ink.

Figure 4:
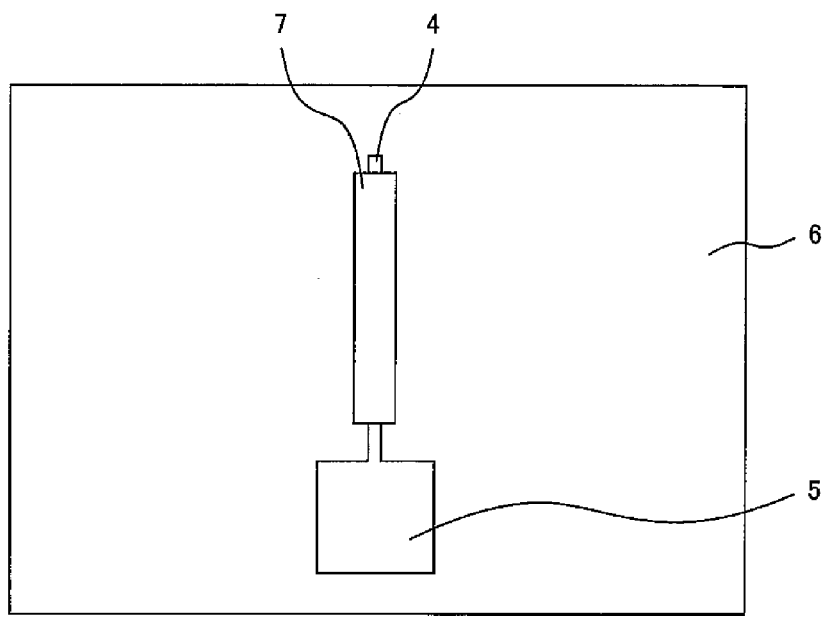
FIG. 4 is a plan view illustrating a substrate after forming a semiconductor layer.

Then, a method for forming a wiring pattern of an organic semiconductor thin film 7 shown in FIG. 4 is to be described. By conducting the forming method described below, even a large pattern size can be formed and direct drawing is possible by an ink jet or a discharge dropping by a dispenser. Alternatively, it is also possible to coating a photosensitive insulation layer and to form a bank by a photolithography, and to fill an organic semiconductor coating material in the bank thereby forming a pattern.

Figure 5:
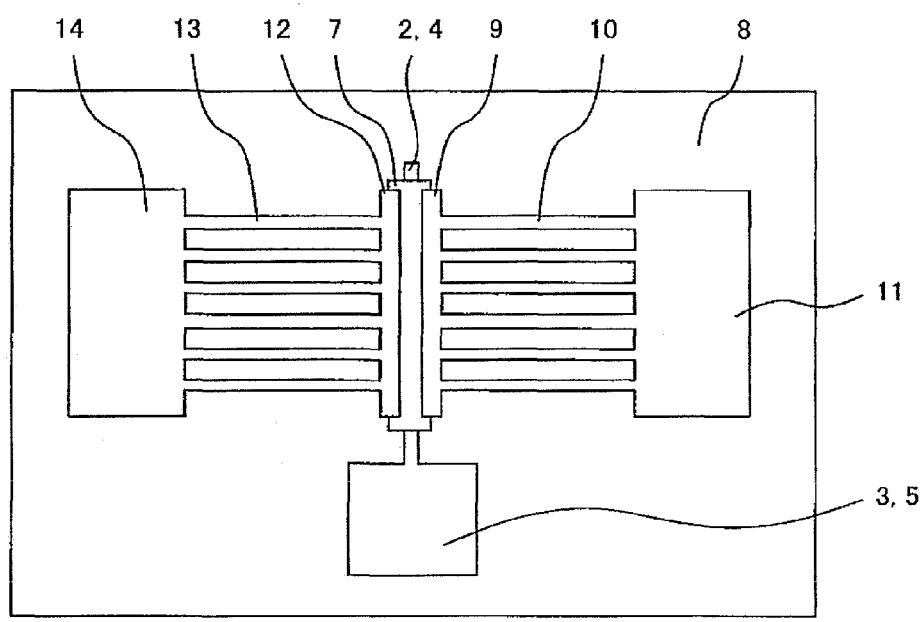
FIG. 5 is an upper plan view illustrating an organic thin film transistor in another embodiment of the present invention.
Figure 6:
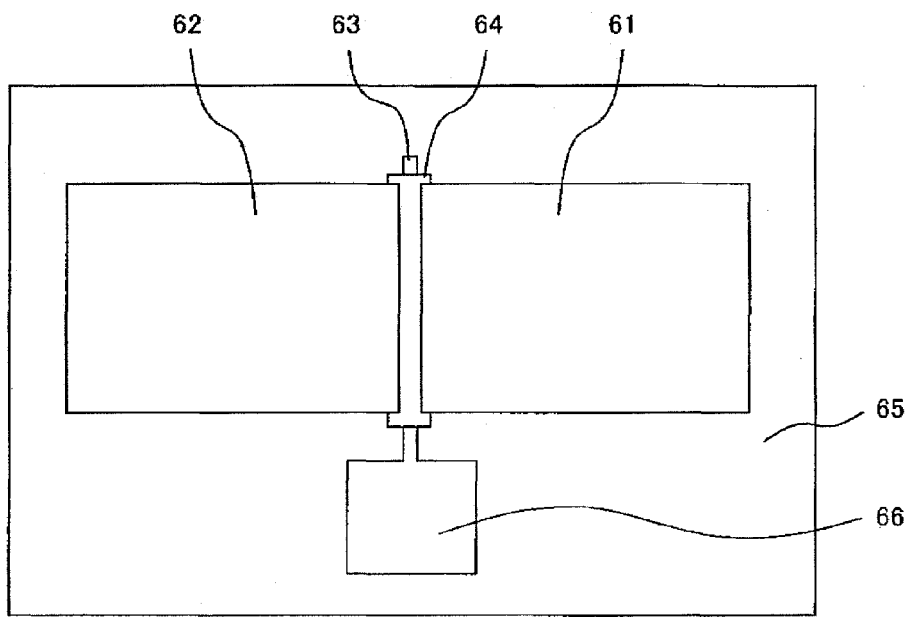
FIG. 6 is an upper plan view illustrating an organic thin film transistor in a prior art.
Figure 7:
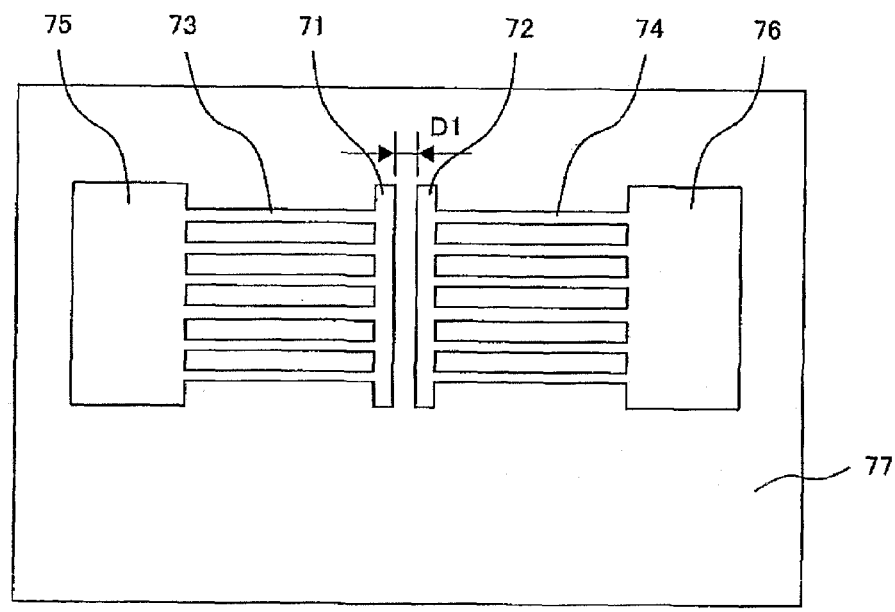
FIG. 7 is a plan view illustrating a source-drain electrode in an embodiment of the present invention.
Figure 8:
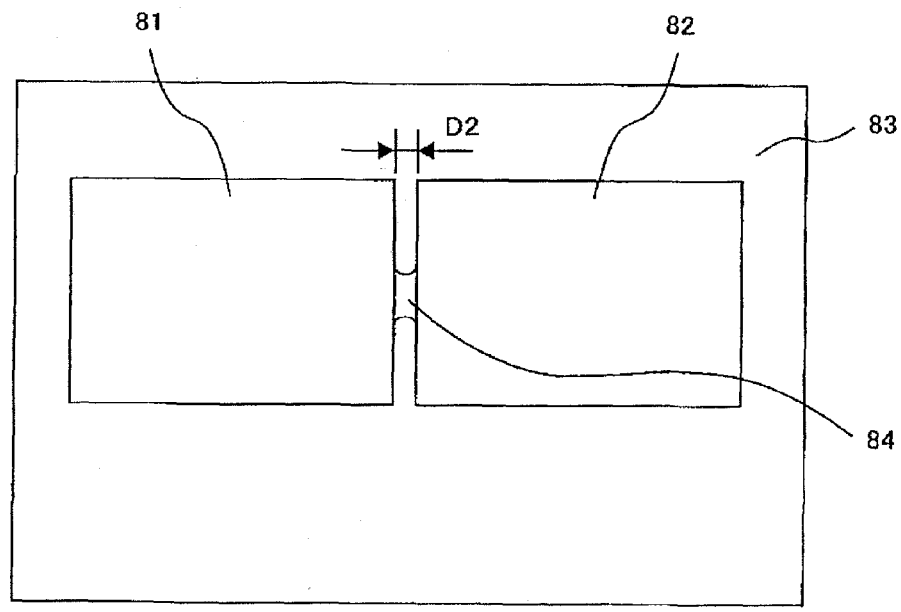
FIG. 8 is a plan view illustrating a source-drain electrode in a prior art.

A formation of a source electrode and a drain electrode by using a method for manufacturing the wiring board in an embodiment of the present invention is to be described with reference to FIG. 5 to FIG. 9. FIG. 5 shows an embodiment of an applying a source electrode film 9 and a drain electrode film 12 to a field effect type organic thin film transistor of the bottom gate structure as described above. FIG. 6 shows an embodiment of applying a source electrode 61 and a drain electrode 62 in a prior art. FIG. 6 also shows a gate dielectric film 63, an organic semiconductor thin film 64, a photosensitive insulation film 65 and a lead electrode 66, corresponding, respectively, to the elements 4, 7, 6 and 3 in FIG. 1. FIG. 7 shows the shapes of a source electrode 72 and a drain electrode 71 in this embodiment, as well as a photosensitive insulation film 77 corresponding to the photosensitive insulation film 6 shown in FIG. 1. FIG. 8 shows the shapes of source electrode 82 and drain electrode 81 in a prior art as well as a photosensitive insulation film 83 corresponding to the photosensitive insulation film 6 shown in FIG. 1.

As shown in FIG. 7 and FIG. 8, a gap distance D1, D2 between the source electrode and the drain electrode is desirably of a size approximate to the gate length of the transistor in view of a performance of the transistor.

Accordingly, in a prior art, source electrodes 61, 82, and drain electrodes 62, 81 are formed by forming a bank, filling a conductive coating material such as a silver nano-ink in which silver nano-particles are dispersed by an organic protective film in a solvent to an inside of the bank and then forming the electrodes by drying and baking treatment.

However, as shown in FIG. 8, since the gap D2 between the source electrode 82 and the drain electrode 81 is narrow, the conductive coating material tends to override the gap and generate short-circuit as 84. For preventing the short-circuit 84, the coating amount cannot but be decreased to thereby reduce the layer thickness. However, when the coating amount is decreased excessively, the coating solution is pulled to an outer periphery of the bank and tends to cause dry-up in a central portion of an electrode pattern. Then, this causes a variation of an electrode resistance.

In this embodiment, as shown in FIG. 5 and FIG. 7, a source electrode film 9, 72 and a drain electrode film 12, 71 constituting channel ends are formed as a trench for a fine wire, and a plurality of grooves 10, 13, 73 and 74 connected therewith and banks 11, 14, 75 and 76 connected to the other ends of the trenches are formed.

The comb-like electrode formed in the trenches has high liquid retentivity of keeping the liquid coating material and causes less inter-electrode short-circuit 84 as shown in FIG. 8. When the coating material is coated excessively, since the banks 11, 14, 75 and 76 have a buffer function, a normal state can be obtained rapidly. Even when a stack coating step is introduced for increasing the film thickness, a possibility of short-circuits between electrodes is lowered.

Figure 9:
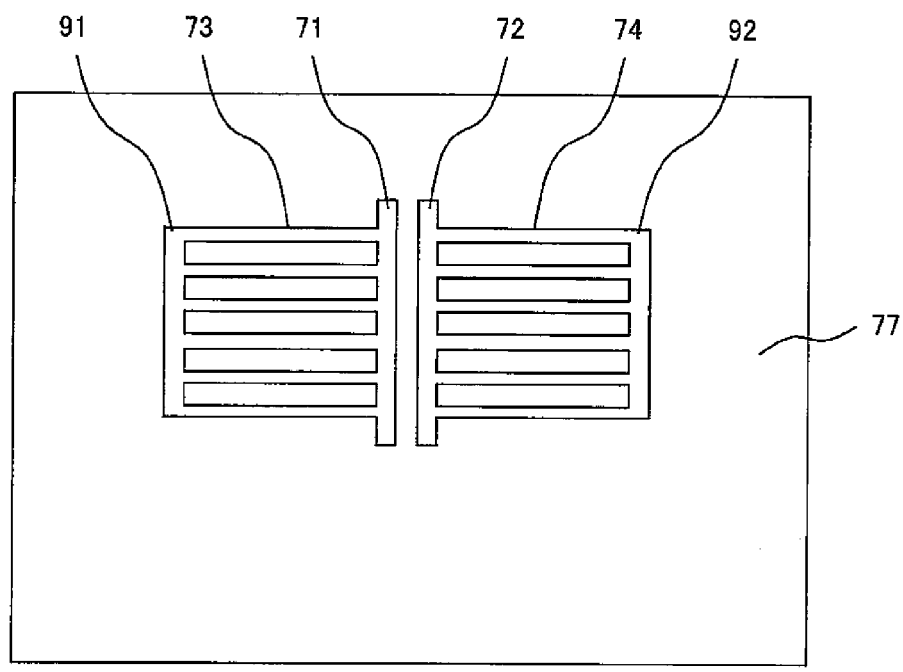
FIG. 9 is a plan view illustrating a source-drain electrode in another embodiment of the present invention.

When the number of the trenches increases, since the retention amount of the coating liquid also increases, the bank may be saved as shown in FIG. 9. In this embodiment, since a thickness of a liquid film in the trench can be controlled automatically by the buffer function as described above, a high speed coating and a pattern formation comparable with those obtained by a printing press can be attained by blowing out the liquid, for example, by a method of using an air knife so as to be within an applicable range of the automatic control after coating the liquid film of the coating material in a somewhat larger amount to the surface of the substrate, for example, by using a roll coater.

As described above, an organic thin film transistor having good performance can be formed at a low cost and throughput comparable with those obtained by a printing. Further, a field effect organic thin film transistor of top gate structure can also be formed by the same manufacturing method.

According to this embodiment, a wiring board and an electronic circuit having a good fine wire pattern and a good narrow gap between the patterns using the coating material can be prepared. Since this can be attained by a development of the printing technique, a reduction of the cost for the organic thin film electronic device and the electronic circuit can be attained.

What is claimed is:

1. A printed wiring board with an electronic device including a source electrode, a drain electrode and a gate electrode of a field effect transistor, comprising:
   at least two sets of trenches, each set being arranged in parallel; and
   a common trench disposed at ends of the trenches on one side of the trenches,
   wherein the source electrode is disposed in one set of the trenches,
   wherein the drain electrode is disposed in another set of the trenches,
   wherein the gate electrode is disposed in the common trench,
   wherein a gate insulation film is disposed on the gate electrode, and a semiconductor film is disposed on the gate insulation film and is interposed between the source's electrode and the drain electrode, and
   wherein the source electrode, the drain electrode and the gate electrode each include metal particles.

2. The printed wiring board according to claim 1, wherein a photosensitive resin is disposed on the semiconductor film.

3. The printed wiring board according to claim 1, wherein a bank is disposed on ends of the trenches on another side,
   wherein the bank includes metal particles, and
   wherein the metal particles in the bank are connected to the source electrode and the drain electrode.

4. The printed wiring board according to claim 3, wherein said metal particles in said bank and in said electrodes includes silver nano-particles.

5. The printed wiring board according to claim 1, wherein said metal particles include silver nano-particles.

* * * * *